(12) United States Patent
Eom et al.

(10) Patent No.: US 12,506,125 B2
(45) Date of Patent: Dec. 23, 2025

(54) STRETCHABLE DISPLAY DEVICE

(71) Applicant: LG Display Co., Ltd., Seoul (KR)

(72) Inventors: HyeSeon Eom, Seoul (KR); DooHyun Yoon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 828 days.

(21) Appl. No.: 17/528,544

(22) Filed: Nov. 17, 2021

(65) Prior Publication Data

US 2022/0165720 A1  May 26, 2022

(30) Foreign Application Priority Data

Nov. 20, 2020 (KR) .................. 10-2020-0156713

(51) Int. Cl.
*H01L 25/16* (2023.01)
*H10H 20/857* (2025.01)

(52) U.S. Cl.
CPC .......... *H01L 25/162* (2013.01); *H01L 25/167* (2013.01); *H10H 20/857* (2025.01)

(58) Field of Classification Search
CPC ..... H01L 25/162; H01L 25/167; H01L 33/62; H01L 23/4985; H01L 25/0753; H01L 27/156; H01L 27/1214; H10H 20/857; H10H 29/142; H10D 86/40
See application file for complete search history.

(56) References Cited

U.S. PATENT DOCUMENTS

2020/0161276 A1* 5/2020 Kim .................. H10K 59/131

FOREIGN PATENT DOCUMENTS

| KR | 2020-0009921 A | 1/2020 |
| KR | 2020-0039973 A | 4/2020 |
| KR | 2020-0040039 A | 4/2020 |
| KR | 10-2020-0059141 A | 5/2020 |
| KR | 10-2020-0081220 A | 7/2020 |

* cited by examiner

*Primary Examiner* — Davienne N Monbleau
*Assistant Examiner* — John Patrick Cornely
(74) *Attorney, Agent, or Firm* — Seed Intellectual Property Law Group LLP

(57) ABSTRACT

According to an aspect of the present disclosure, the display device includes a stretchable lower substrate and a plurality of first substrates disposed on the lower substrate and in which pixels are disposed. The display device also includes a plurality of second substrates connecting first substrates adjacent to each other among the plurality of first substrates. The display device further includes a plurality of connection lines disposed on the plurality of second substrates and connecting the pixels.

28 Claims, 7 Drawing Sheets

STRETCHABLE DISPLAY DEVICE

CROSS-REFERENCE TO RELATED APPLICATIONS

This application claims the priority of Korean Patent Application No. 10-2020-0156713 filed on Nov. 20, 2020, in the Korean Intellectual Property Office, the disclosure of which is incorporated herein by reference.

BACKGROUND

Technical Field

The present disclosure relates to a display device, and more particularly, to a stretchable display device in which connection lines may be disposed in various ways.

Description of the Related Art

Display devices employed by the monitor of a computer, a TV, a mobile phone or the like include an organic light emitting display (OLED) that emits light by itself, and a liquid crystal display (LCD) that requires a separate light source.

As the display devices have been increasingly applied to diverse fields such as a computer monitor, a TV, and a personal mobile device, display devices having a large active area and a reduced volume and weight have been studied.

BRIEF SUMMARY

The inventors of the present disclosure have appreciated the benefits of having a display device in which display elements, wiring lines, etc., are formed on a flexible substrate made of flexible plastic and which may be stretched in a specific direction and manufactured to be capable of changing into various shapes.

One or more embodiments of the present disclosure provide a display device in which a step of an active area may be reduced.

One or more embodiments of the present disclosure provide a display device in which a line resistance may be reduced.

Further embodiments of the present disclosure provide a display device which is not damaged even when repeatedly stretched.

Technical benefits of the present disclosure are not limited to the above-mentioned benefits, and other benefits, which are not mentioned above, can be clearly understood by those skilled in the art from the following descriptions.

According to an aspect of the present disclosure, the display device includes a stretchable lower substrate and a plurality of first substrates disposed on the lower substrate and in which pixels are disposed. The display device also includes a plurality of second substrates connecting first substrates adjacent to each other among the plurality of first substrates. The display device further includes a plurality of connection lines disposed on the plurality of second substrates and connecting the pixels. The first substrate includes a first lower insulating substrate, a first conductive substrate and a first upper insulating substrate which are sequentially laminated. The second substrate includes a second lower insulating substrate, a second conductive substrate and a second upper insulating substrate which are sequentially laminated. A plurality of display elements is disposed in a first area of the first substrate, and a driving element for driving all the plurality of display elements and an inorganic layer are disposed in a second area of the first substrate. An organic layer covering the plurality of display elements and the driving element is disposed in the first area and the second area of the first substrate. Thus, it is possible to suppress a driving failure of the display device.

According to another aspect of the present disclosure, the display device includes a ductile substrate that is reversibly expandable and contractible. The display device also includes a plurality of first rigid substrates disposed on the ductile substrate and having a plate shape. The display device further includes a plurality of second rigid substrates disposed between the plurality of first rigid substrates and having a curved shape. The display device also includes a plurality of connection lines disposed on the plurality of second rigid substrates. The first rigid substrate is provided with a first conductive substrate, and the second rigid substrate is provided with a second conductive substrate. The plurality of connection lines, a plurality of first conductive substrates and a plurality of second conductive substrates are electrically connected. Thus, it is possible to reduce a step of an active area and thus it is possible to improve the process stability.

According to the present disclosure, a plurality of display elements is connected to a single driving element. Thus, it is possible to suppress a driving failure of a sub-pixel.

Other detailed matters of the embodiments are included in the detailed description and the drawings.

According to the present disclosure, a step of an active area may be reduced. Thus, it is possible to remarkably improve the process stability.

According to the present disclosure, a voltage drop of low-potential power and high-potential power may be reduced or minimized. Thus, it is possible to stably display an image.

According to the present disclosure, when a display device is repeatedly stretched, the components are not damaged. Thus, the stretching reliability may be improved.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
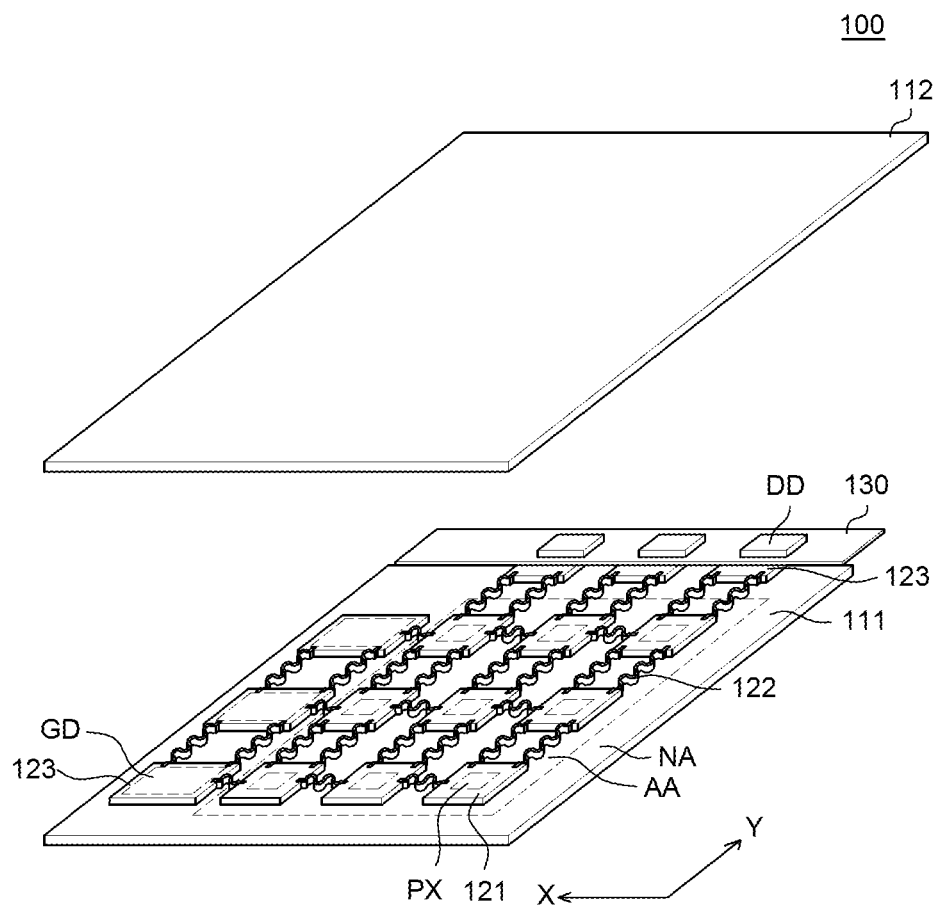
FIG. 1 is an exploded perspective view of a display device according to an embodiment of the present disclosure.

The advantages and features of the present disclosure, and methods for accomplishing the same will be more clearly understood from embodiments described below with reference to the accompanying drawings. However, the present disclosure is not limited to the following embodiments but may be implemented in various different forms. The embodiments are provided only to complete disclosure of the present disclosure and to fully provide a person with ordinary skill in the art to which the present disclosure pertains with the category of the present disclosure.

The shapes, dimensions, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is referred to as being "on" another element or layer, it may be directly on the other element or layer, or intervening elements or layers may be present.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since the dimensions and thickness of each component illustrated in the drawings are represented for convenience in explanation, the present disclosure is not necessarily limited to the illustrated dimensions and thickness of each component.

The features of various embodiments of the present disclosure can be partially or entirely coupled to or combined with each other and can be interlocked and operated in technically various ways, and the embodiments can be carried out independently of or in association with each other.

Hereinafter, various embodiments of the present disclosure will be described in detail with reference to the accompanying drawings.

Display Device

A display device which is capable of displaying an image even when bent or stretched may be referred to as a stretchable display device. The display device may have higher flexibility than conventional typical display devices and may have stretchability. Thus, a user may bend or stretch the display device, and the shape of the display device may be freely changed in response to a manipulation of the user. For example, when the user seizes an end of the display device and pulls the display device, the display device may be stretched in a direction of being pulled by the user. When the user places the display device on an uneven external surface, the display device may be bent along the shape of the external surface of a wall surface. Also, when force applied by the user is removed, the display device can be restored to its original shape.

FIG. 1 is an exploded perspective view of a display device according to an embodiment of the present disclosure. Referring to FIG. 1, a display device 100 includes a lower substrate 111, an upper substrate 112, a plurality of first substrates 121, a plurality of second substrates 122, a plurality of third substrates 123 and a printed circuit board 130. Also, the display device 100 may include a plurality of pixels PX, a gate driver GD and a data driver DD.

The lower substrate 111 is a substrate for supporting and protecting various components of the display device 100. Further, the upper substrate 112 is a substrate for covering and protecting various components of the display device 100.

Each of the lower substrate 111 and the upper substrate 112 is a ductile substrate and may be made of a bendable or stretchable insulating material. For example, each of the lower substrate 111 and the upper substrate 112 may be made of silicone rubber such as polydimethylsiloxane (PDMS) and an elastomer such as polyurethane (PU), or polytetrafluoroethylene (PTFE). Thus, each of the lower substrate 111 and the upper substrate 112 may have flexible properties. Further, the lower substrate 111 and the upper substrate 112 may be made of the same material, but are not limited thereto, and the material may be variously modified.

Each of the lower substrate 111 and the upper substrate 112 is a ductile substrate and may be reversibly expandable and contractible. Thus, the lower substrate 111 may also be referred to as a lower ductile substrate or a first ductile substrate, and the upper substrate 112 may also be referred to as an upper ductile substrate or a second ductile substrate. Also, the lower substrate 111 and the upper substrate 112 may have a modulus of elasticity in the range of several to hundreds of MPa. Further, the lower substrate 111 and the upper substrate 112 may have a ductile breaking rate of 100% or more. Herein, the ductile breaking rate refers to an extension distance when an object to be stretched is broken or cracked. The lower substrate may have a thickness of 10 μm to 1 mm, but is not limited thereto.

The lower substrate 111 may have an active area AA and a non-active area NA surrounding the active area AA.

The active area AA is an area where an image is displayed on the display device 100. The plurality of pixels PX is disposed in the active area AA. Also, each pixel PX may include at least one display element and various driving elements for driving the at least one display element. The various driving elements may include at least one thin film transistor (TFT) and a capacitor, but are not limited thereto. Further, each of the plurality of pixels PX may be connected to various lines. For example, each of the plurality of pixels PX may be connected to various lines such as a gate line, a data line, a high-potential power line, a low-potential power line and a reference voltage line.

The non-active area NA is an area where an image is not displayed. The non-active area NA may be an area disposed adjacent to the active area AA and surrounding the active area AA, but is not limited thereto. The non-active area NA is an area of the lower substrate 111 except the active area AA and may be transformed and separated in various shapes. In the non-active area NA, driving elements for driving the plurality of pixels PX disposed in the active area AA are disposed. In the non-active area NA, the gate driver GD may be disposed. Further, in the non-active area NA, a plurality of pads connected to the gate driver GD and the data driver DD may be disposed. Each of the pads may be connected to each of the plurality of pixels PX disposed in the active area AA.

On the lower substrate 111, the plurality of first substrates 121, the plurality of second substrates 122 and the plurality of third substrates 123 are disposed.

The plurality of first substrates 121 is disposed in the active area AA of the lower substrate 111, and the plurality of pixels PX is disposed on the plurality of first substrates 121. Further, the plurality of third substrates 123 is disposed in the non-active area NA of the lower substrate 111, and the gate driver GD and the plurality of pads are formed on the plurality of third substrates 123.

As shown in FIG. 1, the gate driver GD may be mounted on a third substrate 123 located on one side of an X-axis direction of the active area AA among the plurality of third substrates 123. The gate driver GD may be formed on the third substrate 123 in a gate in panel (GIP) manner when various components on a first substrate 121 are fabricated. Accordingly, various circuit components constituting the gate driver GD, such as various transistors, capacitors, lines and the like, may be disposed on the plurality of third substrates 123. However, the present disclosure is not limited thereto. The gate driver GD may be mounted in a chip on film (COF) manner. Also, the plurality of third substrates 123 may be disposed in the non-active area NA located on the other side of the X-axis direction of the active area AA. The gate drivers GD may also be mounted on the plurality of third substrates 123 located on the other side of the X-axis direction of the active area AA.

Referring to FIG. 1, the plurality of third substrates 123 may be greater in size than the plurality of first substrates 121. Specifically, each of the plurality of third substrates 123 may be greater in size than each of the plurality of first substrates 121. As described above, the gate driver GD may be disposed on each of the plurality of third substrates 123. For example, one stage of the gate driver GD may be disposed on each of the plurality of third substrates 123. Accordingly, the area of various circuit components constituting one stage of the gate driver GD is relatively greater than the area of a first substrate 121 on which a pixel PX is disposed. Therefore, each of the plurality of third substrates 123 may be greater in size than each of the plurality of first substrates 121.

FIG. 1 illustrates that the plurality of third substrates 123 is disposed on one side of a Y-axis direction and one side of the X-axis direction in the non-active area NA. However, the present disclosure is not limited thereto. The plurality of third substrates 123 may be disposed in any portion of the non-active area NA. Also, FIG. 1 illustrates that each of the plurality of first substrates 121 and the plurality of third substrates 123 has a quadrangular plate shape. However, the present disclosure is not limited thereto. Each of the plurality of first substrates 121 and the plurality of third substrates 123 may have various shapes.

Each of the plurality of second substrates 122 connects first substrates 121 adjacent to each other, third substrates 123 adjacent to each other, or a first substrate 121 and a third substrate 123 adjacent to each other. Thus, each of the plurality of second substrates 122 may also be referred to as a connection substrate. That is, the plurality of second substrates 122 is disposed between the plurality of first substrates 121, between the plurality of third substrates 123, or between the plurality of first substrates 121 and the plurality of third substrates 123.

Referring to FIG. 1, the plurality of second substrates 122 has a curved shape. For example, the plurality of second substrates 122 may have a sine wave shape. However, the shape of the plurality of second substrates 122 is not limited thereto. The plurality of second substrates 122 may have various shapes. For example, the plurality of second substrates 122 may be extended in a zigzag manner, or a plurality of diamond-shaped substrates may be extended by being connected to each other at their vertices. The number and shape of the plurality of second substrates 122 shown in FIG. 1 are provided by way of example. The number and shape of the plurality of second substrates 122 may vary depending on the design.

The plurality of first substrates 121, the plurality of second substrates 122 and the plurality of third substrates 123 are rigid substrates. That is, the plurality of first substrates 121, the plurality of second substrates 122 and the plurality of third substrates 123 are more rigid than the lower substrate 111. The plurality of first substrates 121, the plurality of second substrates 122 and the plurality of third substrates 123 may be higher in modulus of elasticity than the lower substrate 111. The modulus of elasticity is a parameter showing the ratio of deformation of a substrate caused by a stress applied to the substrate, and when the modulus of elasticity is relatively high, the hardness may be relatively high. Thus, a first substrate 121, a second substrate 122 and a third substrate 123 may also be referred to as a first rigid substrate, a second rigid substrate and a third rigid substrate, respectively. The modulus of elasticity of the plurality of first substrates 121, the plurality of second substrates 122 and the plurality of third substrates 123 may be 100 times or more higher than that of the lower substrate 111, but is not limited thereto.

The plurality of first substrates 121, the plurality of second substrates 122 and the plurality of third substrates 123 which are rigid substrates may be made of a material having a lower flexibility than the lower substrate 111.

Specifically, in the display device 100 according to an embodiment of the present disclosure, the first substrate 121 may include a first lower insulating substrate, a first conductive substrate and a first upper insulating substrate which are sequentially laminated. Also, the second substrate 122 may include a second lower insulating substrate, a second conductive substrate and a second upper insulating substrate which are sequentially laminated.

That is, each of the first substrate 121 and the second substrate 122 may have a three-layered structure including an insulating layer, a conductive layer and an insulating layer. A lamination relationship of the first substrate 121 and the second substrate 122 will be described in detail below with reference to FIG. 4.

Each of the first lower insulating substrate, the first upper insulating substrate, the second lower insulating substrate and the second upper insulating substrate may be made of a plastic material having a low flexibility. For example, each of the first lower insulating substrate, the first upper insulating substrate, the second lower insulating substrate and the second upper insulating substrate may be made of polyimide (PI), polyacrylate, polyacetate, or the like, but is not limited thereto.

As described above, the first conductive substrate and the second conductive substrate may be made of a metal material having a low flexibility. For example, the first conductive substrate and the second conductive substrate may be made of any one of molybdenum (Mo), aluminum (Al), chromium (Cr), gold (Au), titanium (Ti), nickel (Ni), neodymium (Nd) and copper (Cu). Alternatively, the first conductive substrate and the second conductive substrate may be made of an alloy of two or more of them, or a plurality of layers thereof, but are not limited thereto.

Meanwhile, unlike the first substrate 121 and the second substrate 122, each of the plurality of third substrates 123 may be a single layer made of a plastic material having a low flexibility, but is not limited thereto.

In some embodiments, the lower substrate 111 may be defined as including a plurality of first lower patterns and a second lower pattern. The plurality of first lower patterns may be disposed in an area of the lower substrate 111 which overlaps with the plurality of first substrates 121 and the plurality of third substrates 123. Also, the second lower pattern may be disposed in an area excluding the area where the plurality of first substrates 121 and the plurality of third substrates 123 are disposed. Otherwise, the second lower pattern may be disposed in the entire area of the display device 100.

In this case, the first lower patterns may have a higher modulus of elasticity than the second lower pattern. For example, the plurality of first lower patterns may be made of the same material as the plurality of first substrates 121 and the plurality of third substrates 123. Also, the second lower pattern may be made of a material having a lower modulus of elasticity than the plurality of first substrates 121 and the plurality of third substrates 123.

That is, the first lower patterns may be made of polyimide (PI), polyacrylate, polyacetate or the like. The second lower pattern may be made of silicone rubber such as polydimethylsiloxane (PDMS) and an elastomer such as polyurethane (PU), or polytetrafluoroethylene (PTFE).

The gate driver GD is a component that supplies a gate voltage to the plurality of pixels PX disposed in the active area AA. The gate driver GD includes a plurality of stages formed on the plurality of third substrates 123, and the stages of the gate driver GD may be electrically connected to each other. Therefore, a gate voltage output from one stage may be transferred to another stage. Also, each stage may sequentially supply a gate voltage to the plurality of pixels PX connected to the stage.

A power supply may be connected to the gate driver GD and may supply a gate driving voltage and a gate clock voltage to the gate driver GD. Further, the power supply may be connected to the plurality of pixels PX and may supply a pixel driving voltage to each of the plurality of pixels PX. That is, the power supply may also be formed on the plurality of third substrates 123. The power supply may be formed adjacent to the gate driver GD on an outer substrate. Furthermore, power supplies formed on the plurality of third substrates 123 may be electrically connected to each other. That is, a plurality of power supplies formed on the plurality of third substrates 123 may be connected by a gate power connection line and a pixel power connection line. Thus, each of the plurality of power supplies may supply a gate driving voltage, a gate clock voltage and a pixel driving voltage.

The printed circuit board 130 is configured to transfer a signal and voltage for driving a display element from a controller to the display element. Thus, the printed circuit board 130 may also be referred to as a driving substrate. On the printed circuit board 130, the controller such as an IC chip, or a circuit may be mounted. Further, on the printed circuit board 130, a memory, a processor or the like may also be mounted. Further, the printed circuit board 130 provided in the display device 100 may include a stretchable area and a non-stretchable area to secure stretchability. Also, on the non-stretchable area, an IC chip, a circuit, a memory, a processor or the like may be mounted. Further, in the stretchable area, lines electrically connected to the IC chip, the circuit, the memory and the processor may be disposed. Furthermore, the printed circuit board 130 may be bonded to the plurality of pads of the plurality of third substrates 123 disposed in the non-active area NA.

The data driver DD is a component that supplies a data voltage to the plurality of pixels PX disposed in the active area AA. The data driver DD may be configured as an IC chip and thus may also be referred to as a data integrated circuit (D-IC). Also, the data driver DD may be provided in the non-stretchable area of the printed circuit board 130. That is, the data driver DD may be mounted on the printed circuit board 130 in a chip on board (COB) manner. Further, the data driver DD supplies a data voltage or the like to each of the plurality of pixels PX disposed in the active area AA through the plurality of pads disposed on the plurality of third substrates 123. However, FIG. 1 illustrates that the data driver DD is mounted in the COB manner. However, the present disclosure is not limited thereto. The data driver DD may be mounted in the COF manner, the chip on glass (COG) manner, a tape carrier package (TCP) manner, or the like.

Also, FIG. 1 illustrates that a third substrate 123 is disposed in the non-active area NA on an upper side of the active area AA so as to correspond to a first substrate 121 disposed on a row in the active area AA. Further, FIG. 1 illustrates that a data driver DD is disposed on the printed circuit board 130. However, the present disclosure is not limited thereto. That is, a third substrate 123 and a data driver DD may be disposed so as to correspond to first substrates 121 disposed on a plurality of rows.

Hereinafter, the active area AA of the display device 100 according to an embodiment of the present disclosure will be described in more detail with reference to FIG. 2 through FIG. 4.

Placement in Active Area

Figure 2:
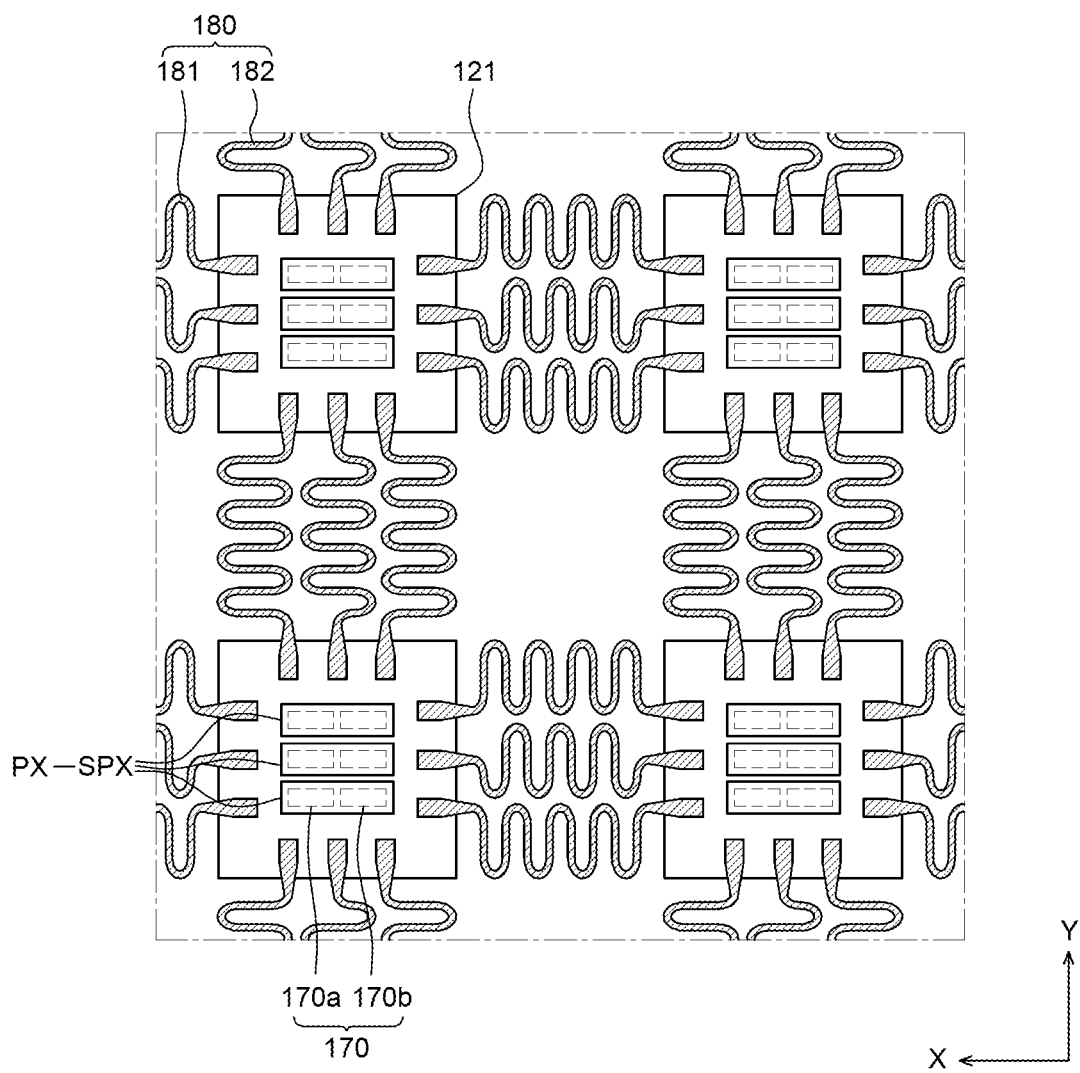
FIG. 2 is an enlarged plan view illustrating a plurality of pixels of the display device according to an embodiment of the present disclosure.

FIG. 2 is an enlarged plan view illustrating a plurality of pixels of the display device according to an embodiment of the present disclosure. FIG. 3 is an enlarged plan view illustrating a pixel of the display device according to an embodiment of the present disclosure. FIG. 4 is a schematic cross-sectional view as taken along a line IV-IV' of FIG. 3.

Figure 3:
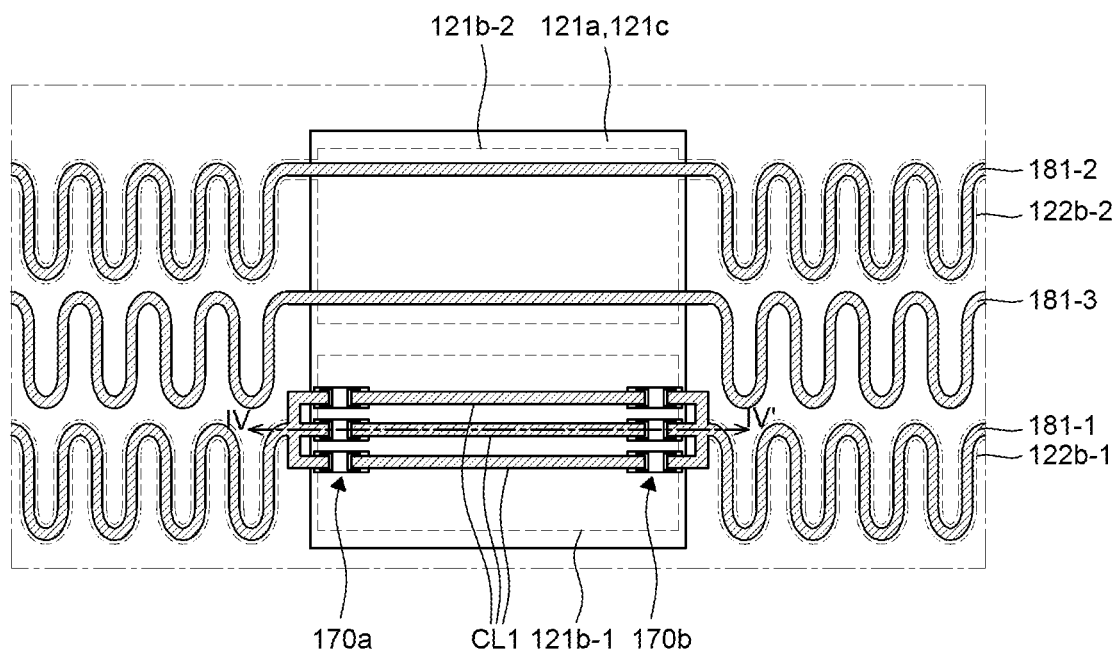
FIG. 3 is an enlarged plan view illustrating a pixel of the display device according to an embodiment of the present disclosure.

For the convenience of description, FIG. 3 illustrates only a placement relationship between a pixel and a first connection line 181. In FIG. 3, a first lower insulating substrate 121a and a first upper insulating substrate 121c are illustrated by a solid line, and a first conductive substrate 121b and a second conductive substrate 122b are illustrated by a dotted line.

Referring to FIG. 1 and FIG. 2, the plurality of first substrates 121 is disposed on the lower substrate 111 in the active area AA. The plurality of first substrates 121 is disposed to be spaced apart from each other on the lower substrate 111. For example, the plurality of first substrates 121 may be disposed in a matrix form on the lower substrate 111 as shown in FIG. 1, but is not limited thereto.

Referring to FIG. 2, a pixel PX including a plurality of sub-pixels SPX is disposed on the first substrate 121. Also, each of the sub-pixels SPX may include an LED 170, which is a display element, and a driving transistor 160 and a switching transistor 150, which are driving elements for driving the LED 170. Specifically, a sub-pixel SPX may include a first LED 170a and a second LED 170b, and the first LED 170a and the second LED 170b may be electrically connected to the same driving element. Thus, a single driving element can drive both the first LED 170a and the second LED 170b. Further, the first LED 170a and the second LED 170b provided in the sub-pixel SPX may display the same color. Thus, in the sub-pixel SPX, the first LED 170a and the second LED 170b may be driven by a single driving element to display a single color.

However, in the sub-pixel SPX, a display element is not limited to an LED, and an organic LED may be used. Also, the plurality of sub-pixels SPX may include a red sub-pixel, a green sub-pixel and a blue sub-pixel, but is not limited thereto. The colors of the plurality of sub-pixels SPX may be changed variously if necessary.

In a conventional display device, display elements are matched one to one with driving elements. In this case, when the display elements are misaligned with the driving elements, the display elements are not driven.

However, in the display device 100 according to an embodiment of the present disclosure, a plurality of display elements is connected to a single driving element. Thus, even when a display element is misaligned with the driving element, another display element may be connected to the driving element. Accordingly, in the display device 100 according to an embodiment of the present disclosure, a driving failure of a sub-pixel can be suppressed. Therefore, it is possible to improve a drive failure rate of the display device 100 according to an embodiment of the present disclosure.

Also, referring to FIG. 2, connection lines 180 include first connection lines 181 and second connection lines 182. The first connection lines 181 and the second connection lines 182 are disposed between the plurality of first substrates 121. Specifically, the first connection line 181 refers to a line extended in the X-axis direction between the plurality of first substrates 121 among the connection lines 180. The second connection line 182 refers to a line extended in the Y-axis direction between the plurality of first substrates 121 among the connection lines 180.

The connection lines 180 may be made of a metal material such as copper (Cu), aluminum (Al), titanium (Ti) or molybdenum (Mo). Otherwise, the connection lines 180 may have a laminated structure of metal materials such as copper/molybdenum-titanium (Cu/MoTi), or titanium/aluminum/titanium (Ti/Al/Ti), but are not limited thereto.

In a general display device, various lines such as a plurality of gate lines and a plurality of data lines are extended in straight lines and are disposed between a plurality of sub-pixels. Also, the plurality of sub-pixels is connected to a single signal line. Therefore, in the general display device, various lines such as a gate line, a data line, a high-potential power line and a reference voltage line are continuously extended on a substrate from one side to the other side of an organic light emitting display device.

Unlike this, in the display device 100 according to an embodiment of the present disclosure, various lines such as a gate line, a data line, a high-potential power line and a reference voltage line which are formed in straight lines and considered to be used in the general organic light emitting display device, are disposed only on the plurality of first substrates 121 and the plurality of third substrates 123. That is, in the display device 100 according to an embodiment of the present disclosure, lines formed in straight lines are disposed only on the plurality of first substrates 121 and the plurality of third substrates 123.

In the display device 100 according to an embodiment of the present disclosure, the pads on two adjacent first substrates 121 or two adjacent third substrate 123 may be connected by the connection lines 180 to connect discontinuous lines on the first substrates 121 or the third substrates 123. That is, the connection lines 180 electrically connect the pads on the two adjacent first substrates 121, the two adjacent third substrate 123, and the first substrate 121 and the third substrate 123 adjacent to each other. Therefore, the display device 100 according to an embodiment of the present disclosure may include the plurality of connection lines 180 to electrically connect various lines, such as a gate line, a data line, a high-potential power line and a reference voltage line, between the plurality of first substrates 121, between the plurality of third substrates 123 and between the plurality of first substrates 121 and the plurality of third substrates 123. For example, gate lines may be disposed on the plurality of first substrates 121 disposed adjacent to each other in the X-axis direction. Also, the gate pads may be disposed on both ends of the gate lines. In this case, a plurality of gate pads on the plurality of first substrates 121 disposed adjacent to each other in the X-axis direction may be connected to each other by the first connection lines 181 serving as the gate lines. Therefore, the gate lines disposed on the plurality of first substrates 121 and the first connection lines 181 disposed on the third substrates 123 may serve as a single gate line. Further, lines, such as a light emission signal line, a low-potential power line and a high-potential power line which are extended in the X-axis direction among all of various lines that can be included in the display device 100, may also be electrically connected by the first connection lines 181 as described above.

Referring to FIG. 2, the first connection lines 181 may connect pads on two first substrates 121 disposed side by side among the pads on the plurality of first substrates 121 disposed adjacent to each other in the X-axis direction. Each first connection line 181 may serve as a gate line, a light emission signal line, a high-potential power line, or a low-potential power line, but is not limited thereto. For example, the first connection lines 181 may serve as gate lines and electrically connect the gate pads on the two first substrates 121 disposed side by side in the X-axis direction. Therefore, as described above, the gate pads on the plurality of first substrates 121 disposed in the X-axis direction may be connected by the first connection lines 181 serving as the gate lines. A single gate voltage may be transferred to the gate pads.

Further, the second connection lines 182 may connect the pads on two first substrates 121 disposed side by side among the pads on the plurality of first substrates 121 disposed adjacent to each other in the Y-axis direction. Each second connection line 182 may serve as a data line or a reference voltage line, but is not limited thereto. For example, the second connection lines 182 may serve as data lines and electrically connect data lines on two first substrates 121 disposed side by side in the Y-axis direction. Therefore, as described above, internal lines on the plurality of first substrates 121 disposed in the Y-axis direction may be connected by a plurality of second connection lines 182 serving as the data lines. A single data voltage may be transferred to the data lines.

Hereinafter, the planar and cross-sectional structures of the active area will be described in detail with reference to FIG. 3 and FIG. 4.

Planar and Cross-Sectional Structures of Active Area

In the display device 100 according to an embodiment of the present disclosure, the first lower insulating substrate 121a, the first conductive substrate 121b and the first upper insulating substrate 121c constituting the first substrate 121 may be sequentially laminated on the lower substrate 111.

Also, a second lower insulating substrate 122a, the second conductive substrate 122b and a second upper insulating substrate 122c constituting the second substrate 122 may be sequentially laminated on the lower substrate 111.

Figure 4:
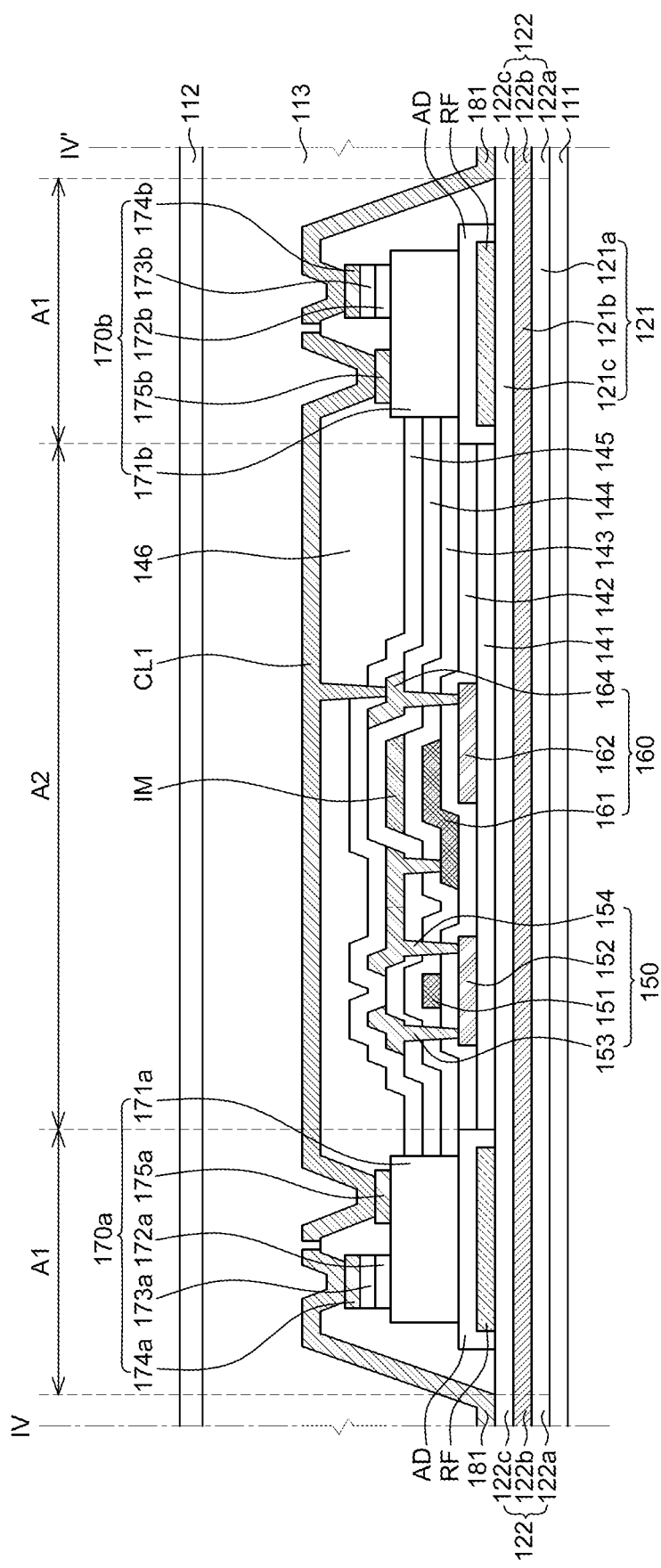
FIG. 4 is a schematic cross-sectional view as taken along a line IV-IV' of FIG. 3.

Referring to FIG. 4, the second lower insulating substrate 122a may be disposed on the same layer as the first lower insulating substrate 121a. Also, the second conductive substrate 122b may be disposed on the same layer as the first conductive substrate 121b. Further, the second upper insulating substrate 122c may be disposed on the same layer as the first upper insulating substrate 121c.

Referring to FIG. 3, the first conductive substrate 121b may be divided into a plurality of conductive substrates or conductive layers disposed to be spaced apart from each other. For example, the first conductive substrate 121b may be divided into a (1-1)th conductive substrate 121b-1 and a (1-2)th conductive substrate 121b-2. Further, the (1-1)th conductive substrate 121b-1 may have the same size as the (1-2)th conductive substrate 121b-2, but the size thereof may vary depending on the necessity for the design.

Also, the second conductive substrate 122b may be included in all of the second substrates 122, but is not limited thereto. For example, the second conductive substrate 122b may be included in only some of the plurality of second substrates 122.

As shown in FIG. 3, if a plurality of first connection lines 181 includes a (1-1)th connection line 181-1, a (1-2)th connection line 181-2 and a (1-3)th connection line 181-3, a (2-1)th conductive substrate 122b-1 may be included in the second substrate 122 overlapping with the (1-1)th connection line 181-1. Also, a (2-2)th conductive substrate 122b-2 may be included in the second substrate 122 overlapping with the (1-2)th connection line 181-2. However, the second conductive substrate 122b may not be included in the second substrate 122 overlapping with the (1-3)th connection line 181-3.

The second conductive substrate 122b may include the (2-1)th conductive substrate 122b-1 and the (2-2)th conductive substrate 122b-2. The (2-1)th conductive substrate 122b-1 may overlap with the (1-1)th connection line 181-1, and the (2-2)th conductive substrate 122b-2 may overlap with the (1-2)th connection line 181-2.

Also, the (1-1)th conductive substrate 121b-1 may be connected to the (2-1)th conductive substrate 122b-1 in the active area. The (2-1)th conductive substrate 122b-1 may be electrically connected to the (1-1)th connection line 181-1 in the non-active area.

Further, the (1-1)th conductive substrate 121b-1 and the (2-1)th conductive substrate 122b-1 may be connected in series to each other. Furthermore, the (1-1)th conductive substrate 121b-1 and the (2-1)th conductive substrate 122b-1 which are connected in series to each other may be connected in parallel to the (1-1)th connection line 181-1.

The (1-2)th conductive substrate 121b-2 may be connected to the (2-2)th conductive substrate 122b-2 in the active area. The (2-2)th conductive substrate 122b-2 may be electrically connected to the (1-2)th connection line 181-2 in the non-active area.

Therefore, the (1-2)th conductive substrate 121b-2 and the (2-2)th conductive substrate 122b-2 may be connected in series to each other. Further, the (1-2)th conductive substrate 121b-2 and the (2-2)th conductive substrate 122b-2 which are connected in series to each other may be connected in parallel to the (1-2)th connection line 181-2.

Thus, when the (1-1)th connection line 181-1 serves as a low-potential power line, all the (1-1)th conductive substrate 121b-1 and the (2-1)th conductive substrate 122b-1 connected in parallel to the (1-1)th connection line 181-1 may be applied with the low-potential power. Therefore, the (1-1)th conductive substrate 121b-1 and the (2-1)th conductive substrate 122b-1 as well as the (1-1)th connection line 181-1 may serve as a low-potential power line.

Also, when the (1-2)th connection line 181-2 serves as a high-potential power line, all the (1-2)th conductive substrate 121b-2 and the (2-2)th conductive substrate 122b-2 connected in parallel to the (1-2)th connection line 181-2 may be applied with the high-potential power. Therefore, the (1-2)th conductive substrate 121b-2 and the (2-2)th conductive substrate 122b-2 as well as the (1-2)th connection line 181-2 may serve as a high-potential power line.

That is, in a display device according to an embodiment of the present disclosure, a low-potential power line and a high-potential power line are not implemented only with the first connection line 181. The first conductive substrate 121b and the second conductive substrate 122b which are connected in series to each other may be connected in parallel to the first connection line 181 to implement a low-potential power line and a high-potential power line.

Accordingly, a line resistance of the low-potential power line and the high-potential power line may be remarkably decreased. Thus, it is possible to reduce or minimize a voltage drop of low-potential power and high-potential power. Therefore, the display device according to an embodiment of the present disclosure may stably display an image.

Meanwhile, referring to FIG. 3 and FIG. 4, the first substrate 121 may be divided into a first area A1 where the first LED 170a and the second LED 170b as a plurality of display elements are disposed and a second area A2 where the driving transistor 160 and the switching transistor 150 as driving elements for driving the plurality of display elements are disposed.

In the first area A1 of the first substrate 121, a reflective layer RF is disposed. The reflective layer RF serves to reflect light emitted toward the lower substrate 111 among light emitted from the LEDs 170a and 170b to an upper portion of the display device 100 and output light to the outside. The reflective layer RF may be made of a metal material having a higher reflectivity.

Meanwhile, the first conductive substrate 121b disposed under the reflective layer RF may also be made of a metal material having a higher reflectivity. Therefore, the light extraction efficiency of the display device 100 may be further increased.

An adhesive layer AD covering the reflective layer RF may be disposed on the reflective layer RF. The adhesive layer AD serves to attach the LEDs 170a and 170b onto the reflective layer RF and insulate the reflective layer RF made of a metal material from the LEDs 170a and 170b. The adhesive layer AD may be made of a thermosetting material or a photo curable material, but is not limited thereto. FIG. 4 illustrates that the adhesive layer AD is disposed to cover only the reflective layer RF. However, the position of the adhesive layer AD is not limited thereto.

The first LED 170a and the second LED 170b are disposed on the adhesive layer AD. Each of the first LED 170a and the second LED 170b is disposed to overlap with the reflective layer RF. The first LED 170a and the second LED 170b include n-type layers 171a and 171b, active layer 172a and 172b, p-type layers 173a and 173b, n-electrodes 175a and 175b and p-electrodes 174a and 174b, respectively. Hereinafter, each of the first LED 170a and the second LED 170b may have a lateral structure.

Specifically, the n-type layers 171a and 171b of the LEDs 170a and 170b are disposed overlapping with the reflective layer RF on the adhesive layer AD. The n-type layers 171a and 171b may be formed by injecting n-type impurities into gallium nitride having excellent crystallinity. The active layers 172a and 172b are disposed on the n-type layers 171a and 171b. The active layers 172a and 172b are light emitting layers that emit light in the LEDs 170a and 170b and may be made of a nitride semiconductor, for example, indium gallium nitride. The p-type layers 173a and 173b are disposed on the active layers 172a and 172b. The p-type layers 173a and 173b may be formed by injecting p-type impurities into gallium nitride. However, materials of the n-type layers 171a and 171b, the active layers 172a and 172b and the p-type layers 173a and 173b are not limited thereto.

The p-electrodes 174a and 174b are disposed on the p-type layers 173a and 173b of the LEDs 170a and 170b. Also, the n-electrodes 175a and 175b are disposed on the n-type layers 171a and 171b of the LEDs 170a and 170b. The n-electrodes 175a and 175b are disposed to be spaced apart from the p-electrodes 174a and 174b. Specifically, the LEDs 170a and 170b may be manufactured by sequentially laminating the n-type layers 171a and 171b, the active layers 172a and 172b, and the p-type layers 173a and 173b, and then, etching predetermined areas of the active layers 172a and 172b and the p-type layers 173a and 173b to thereby form the n-electrodes 175a and 175b and the p-electrodes 174a and 174b. In this case, the predetermined areas may be spaces to separate the n-electrodes 175a and 175b and the p-electrodes 174a and 174b from each other and may be etched to expose a part of the n-type layers 171a and 171b. In other words, surfaces of the LEDs 170a and 170b on which the n-electrodes 175a and 175b and the p-electrodes 174a and 174b are to be disposed may not be flat and may have different levels of height. Thus, the p-electrodes 174a and 174b are disposed on the p-type layers 173a and 173b, and the n-electrodes 175a and 175b are disposed on the n-type layers 171a and 171b. Also, the p-electrodes 174a and 174b and the n-electrodes 175a and 175b are disposed to be spaced apart from each other at different levels of height. Therefore, the n-electrodes 175a and 175b may be disposed closer to the reflective layer RF than the p-electrodes 174a and 174b. Further, the n-electrodes 175a and 175b and the p-electrodes 174a and 174b may be made of conductive materials, for example, transparent conductive oxides. Furthermore, the n-electrodes 175a and 175b and the p-electrodes 174a and 174b may be made of the same material. However, the present disclosure is not limited thereto.

Referring to FIG. 4, in the second area A2 of the first substrate 121, a plurality of inorganic insulating layers is disposed on the plurality of first substrates 121. For example, the plurality of inorganic insulating layers may include a buffer layer 141, a gate insulating layer 142, a first interlayer insulating layer 143, a second interlayer insulating layer 144 and a passivation layer 145, and these layers may be collectively referred to as an inorganic insulating layer or an inorganic layer. However, the present disclosure is not limited thereto. For example, various inorganic insulating layers may be further disposed on the plurality of first substrates 121. One or more of the buffer layer 141, the gate insulating layer 142, the first interlayer insulating layer 143, the second interlayer insulating layer 144 and the passivation layer 145 may be omitted.

The buffer layer 141 is disposed on the plurality of first substrates 121. The buffer layer 141 is formed on the plurality of first substrates 121 to protect various components of the display device 100 against permeation of moisture ($H_2O$) and oxygen ($O_2$) from the outside of the lower substrate 111 and the plurality of first substrates 121. The buffer layer 141 may be made of an insulating material. For example, the buffer layer 141 may be formed as a single inorganic layer or a plurality of inorganic layers of silicon nitride (SiNx), silicon oxide (SiOx) and silicon oxynitride (SiON). However, the buffer layer 141 may be omitted depending on the structure or characteristics of the display device 100.

Here, the buffer layer 141 may be formed only in the second area A2. As described above, the buffer layer 141 may be made of an inorganic material. Thus, the buffer layer 141 may be damaged, such as easily cracked, while the display device 100 is stretched. Accordingly, in the display device 100 according to an embodiment of the present disclosure, the buffer layer 141 is formed only in the second area A2. Thus, it is possible to suppress damage to the buffer layer 141 even when the display device 100 is deformed, such as bent or stretched.

Referring to FIG. 4, the switching transistor 150 including a gate electrode 151, an active layer 152, a source electrode 153 and a drain electrode 154 is formed on the buffer layer 141. Also, the driving transistor 160 including a gate electrode 161, an active layer 162, a source electrode 163 and a drain electrode 164 is formed on the buffer layer 141.

First, referring to FIG. 4, the active layer 152 of the switching transistor 150 and the active layer 162 of the driving transistor 160 are disposed on the buffer layer 141. For example, each of the active layer 152 of the switching transistor 150 and the active layer 162 of the driving transistor 160 may be made of an oxide semiconductor. Alternatively, each of the active layer 152 of the switching transistor 150 and the active layer 162 of the driving transistor 160 may be made of amorphous silicon (a-Si), polycrystalline silicon (poly-Si), an organic semiconductor or the like.

The gate insulating layer 142 is disposed on the active layer 152 of the switching transistor 150 and the active layer 162 of the driving transistor 160. The gate insulating layer 142 is configured to electrically insulate the gate electrode 151 of the switching transistor 150 from the active layer 152 of the switching transistor 150 and electrically insulate the gate electrode 161 of the driving transistor 160 from the active layer 162 of the driving transistor 160. Further, the gate insulating layer 142 may be made of an insulating material. For example, the gate insulating layer 142 may be formed as a single inorganic layer or a plurality of inorganic layers of silicon nitride (SiNx) or silicon oxide (SiOx), but is not limited thereto.

The gate electrode 151 of the switching transistor 150 and the gate electrode 161 of the driving transistor 160 are disposed on the gate insulating layer 142. The gate electrode 151 of the switching transistor 150 and the gate electrode 161 of the driving transistor 160 are disposed to be spaced apart from each other on the gate insulating layer 142. Further, the gate electrode 151 of the switching transistor 150 overlaps with the active layer 152 of the switching transistor 150, and the gate electrode 161 of the driving transistor 160 overlaps with the active layer 162 of the driving transistor 160.

Each of the gate electrode 151 of the switching transistor 150 and the gate electrode 161 of the driving transistor 160 may be made of any one of various metal materials, for example, molybdenum (Mo), aluminum (Al), chromium (Cr), gold (Au), titanium (Ti), nickel (Ni), neodymium (Nd) and copper (Cu). Alternatively, each of the gate electrode 151 of the switching transistor 150 and the gate electrode 161 of the driving transistor 160 may be made of an alloy of two or more of them, or a plurality of layers thereof, but is not limited thereto.

The first interlayer insulating layer 143 is disposed on the gate electrode 151 of the switching transistor 150 and the gate electrode 161 of the driving transistor 160. The first interlayer insulating layer 143 insulates the gate electrode 161 of the driving transistor 160 from an intermediate metal layer IM. The first interlayer insulating layer 143 may also be made of an inorganic material like the buffer layer 141. For example, the first interlayer insulating layer 143 may be formed as a single inorganic layer or a plurality of inorganic layers of silicon nitride (SiNx) or silicon oxide (SiOx), but is not limited thereto.

The intermediate metal layer IM is disposed on the first interlayer insulating layer 143. Further, the intermediate metal layer IM overlaps with the gate electrode 161 of the driving transistor 160. Thus, a storage capacitor is formed in an area where the intermediate metal layer IM overlaps with the gate electrode 161 of the driving transistor 160. Specifically, the gate electrode 161 of the driving transistor 160, the first interlayer insulating layer 143 and the intermediate metal layer IM form the storage capacitor. However, the position of the intermediate metal layer IM is not limited thereto. The intermediate metal layer IM may overlap with another electrode to form a storage capacitor in various ways.

The intermediate metal layer IM may be made of any one of various metal materials, for example, molybdenum (Mo), aluminum (Al), chromium (Cr), gold (Au), titanium (Ti), nickel (Ni), neodymium (Nd) and copper (Cu). Alternatively, the intermediate metal layer IM may be made of an alloy of two or more of them, or a plurality of layers thereof, but is not limited thereto.

The second interlayer insulating layer 144 is disposed on the intermediate metal layer IM. The second interlayer insulating layer 144 insulates the gate electrode 151 of the switching transistor 150 from the source electrode 153 and the drain electrode 154 of the switching transistor 150. Also, the second interlayer insulating layer 144 insulates the intermediate metal layer IM from the source electrode 163 and the drain electrode 164 of the driving transistor 160. The second interlayer insulating layer 144 may also be made of an inorganic material like the buffer layer 141. For example, the second interlayer insulating layer 144 may be formed as a single inorganic layer or a plurality of inorganic layers of silicon nitride (SiNx) or silicon oxide (SiOx), but is not limited thereto.

The source electrode 153 and the drain electrode 154 of the switching transistor 150 are disposed on the second interlayer insulating layer 144. Also, the source electrode 163 and the drain electrode 164 of the driving transistor 160 are disposed on the second interlayer insulating layer 144. The source electrode 153 and the drain electrode 154 of the switching transistor 150 are disposed to be spaced apart from each other on the same layer. Further, although FIG. 3 does not illustrate the source electrode of the driving transistor 160, the source electrode and the drain electrode 164 of the driving transistor 160 are also disposed to be spaced apart from each other on the same layer. In the switching transistor 150, the source electrode 153 and the drain electrode 154 may be electrically connected to the active layer 152 to be in contact with the active layer 152. Also, in the driving transistor 160, the source electrode and the drain electrode 164 may be electrically connected to the active layer 162 to be in contact with the active layer 162. Further, the drain electrode 154 of the switching transistor 150 may be electrically connected to the gate electrode 161 of the driving transistor 160 to be in contact with the gate electrode 161 of the driving transistor 160.

The source electrode 153 and the drain electrodes 154 and 164 may be made of any one of various metal materials, for example, molybdenum (Mo), aluminum (Al), chromium (Cr), gold (Au), titanium (Ti), nickel (Ni), neodymium (Nd) and copper (Cu). Alternatively, the source electrode 153 and the drain electrodes 154 and 164 may be made of an alloy of two or more of them, or a plurality of layers thereof, but are not limited thereto.

Further, in the present disclosure, the driving transistor 160 has been described as having a coplanar structure, but various types of transistors having a staggered structure or the like may also be used.

Further, although not shown in FIG. 4, a gate pad and a data pad may be disposed on the second interlayer insulating layer 144. The gate pad serves to transfer a gate voltage to the plurality of sub-pixels SPX. The gate voltage may be transferred from the gate pad to the gate electrode 151 of the switching transistor 150 through a gate line formed on the first substrate 121. The data pad serves to transfer a data voltage to the plurality of sub-pixels SPX. The data voltage may be transferred from the data pad to the source electrode 153 of the switching transistor 150 through a data line formed on the first substrate 121. The gate pad and the data pad may be made of the same material as the source electrode 153 and the drain electrodes 154 and 164, but are not limited thereto.

Referring to FIG. 4, the passivation layer 145 is formed on the switching transistor 150 and the driving transistor 160. That is, the passivation layer 145 covers the switching transistor 150 and the driving transistor 160 to protect the switching transistor 150 and the driving transistor 160 against permeation of moisture, oxygen, and the like. The passivation layer 145 may be made of an inorganic material and formed as a single layer or a plurality of layers, but is not limited thereto.

Also, the gate insulating layer 142, the first interlayer insulating layer 143, the second interlayer insulating layer 144 and the passivation layer 145 may be patterned and formed only in a plurality of second areas A2. The gate insulating layer 142, the first interlayer insulating layer 143, the second interlayer insulating layer 144 and the passivation layer 145 may also be made of an inorganic material like the buffer layer 141. Thus, the gate insulating layer 142, the first interlayer insulating layer 143, the second interlayer insulating layer 144 and the passivation layer 145 may be damaged, such as easily cracked, while the display device 100 is stretched. Therefore, the gate insulating layer 142, the first interlayer insulating layer 143, the second interlayer insulating layer 144 and the passivation layer 145 may not be formed in areas between the plurality of first substrates 121. The gate insulating layer 142, the first interlayer insulating layer 143, the second interlayer insulating layer 144 and the passivation layer 145 may be patterned only in the second areas A2 of the plurality of first substrates 121.

In other words, the buffer layer 141, the gate insulating layer 142, the first interlayer insulating layer 143, the second interlayer insulating layer 144 and the passivation layer 145 may be disposed in an area corresponding to the second area A2 between the first LED 170a and the second LED 170b. Referring to FIG. 4, both ends of the first interlayer insulating layer 143, the second interlayer insulating layer 144 and the passivation layer 145 may be in contact with a side surface of the first LED 170a and a side surface of the second LED 170b. Ends on one side of the first interlayer insulating layer 143, the second interlayer insulating layer 144 and the passivation layer 145 may be in contact with the n-type layer 171a of the first LED 170a. Also, ends on the other side of the first interlayer insulating layer 143, the second interlayer insulating layer 144 and the passivation layer 145 may be in contact with the n-type layer 171b of the second LED 170b.

However, the present disclosure is not limited thereto. Both ends of the buffer layer 141, the gate insulating layer 142, the first interlayer insulating layer 143, the second interlayer insulating layer 144 and the passivation layer 145 may be in contact with the side surface of the first LED 170a and the side surface of the second LED 170b. Alternatively, both ends of the gate insulating layer 142, the first interlayer insulating layer 143, the second interlayer insulating layer 144 and the passivation layer 145 may be in contact with the side surface of the first LED 170a and the side surface of the second LED 170b.

A planarization layer 146 is formed throughout the first area A1 and the second area A2 to cover the passivation layer 145, the first LED 170a and the second LED 170b. The planarization layer 146 serves to flatten upper portions of the switching transistor 150 and the driving transistor 160 and flatten upper surfaces and side surfaces of the first LED 170a and the second LED 170b. The planarization layer 146 may be formed as a single layer or a plurality of layers and may be made of an organic material. Thus, the planarization layer 146 may also be referred to as an organic insulating layer or an organic layer. For example, the planarization layer 146 may be made of an acrylic-based organic material, but is not limited thereto. Accordingly, the planarization layer 146 may compensate for steps between the side surfaces of the first LED 170a and the second LED 170b. Also, the planarization layer 146 may enhance the adhesion strength between the planarization layer 146 and the connection lines 181 disposed on an upper surface and a side surface of the planarization layer 146.

Referring to FIG. 3 and FIG. 4, a contact line CL1 is disposed on the planarization layer 146. The contact line CL1 serves to electrically connect the driving transistor 160 to the LEDs 170a and 170b. The contact line CL1 may be made of the same material in the same layer as the connection lines 180. Thus, the contact line CL1 may be made of a metal material such as copper (Cu), aluminum (Al), titanium (Ti) or molybdenum (Mo). Otherwise, the contact line CL1 may have a laminated structure of metal materials such as copper/molybdenum-titanium (Cu/MoTi), or titanium/aluminum/titanium (Ti/Al/Ti), but is not limited thereto.

The contact line CL1 is connected to the n-electrodes 175a and 175b of the LEDs 170a and 170b through contact holes formed in the planarization layer 146. Also, the contact line CL1 is connected to the drain electrode 164 of the driving transistor 160 through contact holes formed in the passivation layer 145 and the planarization layer 146. However, the present disclosure is not limited thereto. The contact line CL1 may be connected to the source electrode of the driving transistor 160 depending on the type of the driving transistor 160. The n-electrodes 175a and 175b of the LEDs 170a and 170b may be electrically connected to the drain electrode 164 of the driving transistor 160 by the contact line CL1.

Further, the first connection line 181 is connected to the p-electrodes 174a and 174b of the LEDs 170a and 170b through the contact holes formed in the planarization layer 146. More specifically, as shown in FIG. 4, the first connection line 181 connected to the p-electrodes 174a and 174b of the LEDs 170a and 170b may be in contact with the side surface and a part of the upper surface of the planarization layer 146 disposed on the first substrate 121 and may be extended to an upper surface of the second substrate 122. Therefore, low-potential power, which is a common voltage, may be applied to the p-electrodes 174a and 174b of the LEDs 170a and 170b through the first connection line 181.

When the display device 100 is turned on, a driving voltage corresponding to a data voltage is applied to the drain electrode 164 of the driving transistor 160. Thus, the driving voltage corresponding to a data voltage is applied to the n-electrodes 175a and 175b of the LEDs 170a and 170b through the contact line CL1. Meanwhile, low-potential power, which is a common voltage, is applied to the p-electrodes 174a and 174b of the LEDs 170a and 170b through the first connection line 181. Therefore, the driving voltage and the low-potential power of different levels may be applied to the n-electrodes 175a and 175b and the p-electrodes 174a and 174b, respectively. Thus, the LEDs 170a and 170b may emit light.

Although not illustrated in the drawings, a bank may be further formed on the planarization layer 146 so as not to overlap with the LEDs 170a and 170b. The bank serves to define a sub-pixel PXL. Thus, the bank may be made of an insulating material containing a black material. The bank may be made of, for example, a transparent carbon-based mixture. Specifically, the bank may contain carbon black, but is not limited thereto. The bank may also be made of a transparent insulating material.

Referring to FIG. 4, the upper substrate 112 is disposed on the contact line CL1 so as to face the lower substrate 111. The upper substrate 112 serves to support various components disposed under the upper substrate 112. The upper substrate 112 may be made of the same material as the lower substrate 111. For example, the upper substrate 112 may be made of silicone rubber such as polydimethylsiloxane (PDMS) and an elastomer such as polyurethane (PU), or polytetrafluoroethylene (PTFE). Thus, the upper substrate 112 may have flexibility. However, the materials of the upper substrate 112 are not limited thereto.

Also, a filling layer 113 may be disposed on a front surface of the lower substrate 111 and may serve to fill a space between the upper substrate 112 and the components disposed on the lower substrate 111. As shown in FIG. 4, the filling layer 113 may fill a space between the upper substrate 112 and the first connection line 181 and the contact line CL1 and attach the upper substrate 112 to the first connection line 181 and the contact line CL1. The filling layer 113 may be made of a curable adhesive. Specifically, a material of the filling layer 113 may be coated on the front surface of the lower substrate 111 and then cured to form the filling layer 113. Thus, the filling layer 113 may be disposed between the upper substrate 112 and the first connection line 181 and the contact line CL1.

In a conventional display device, a display element is disposed on a driving element so that a step of an active area in the display device increases in height. Thus, in the conventional display device, a process failure rate may increase due to the high step during a subsequent process after formation of the driving element and the display element.

However, in the display device 100 according to an embodiment of the present disclosure, a plurality of display elements, e.g., LEDs, is disposed in the first area A1 on the first substrate 121. Also, a plurality of driving elements, e.g., a driving transistor and a switching transistor, is disposed in the second area A2 on the first substrate 121. Thus, since the display elements are disposed on both sides of the driving element, a step of an active area in the display device may decreases in height. Therefore, in the display device according to an embodiment of the present disclosure, the low step makes it possible to remarkably improve the process stability.

Circuit Structure of Active Area

Figure 5:
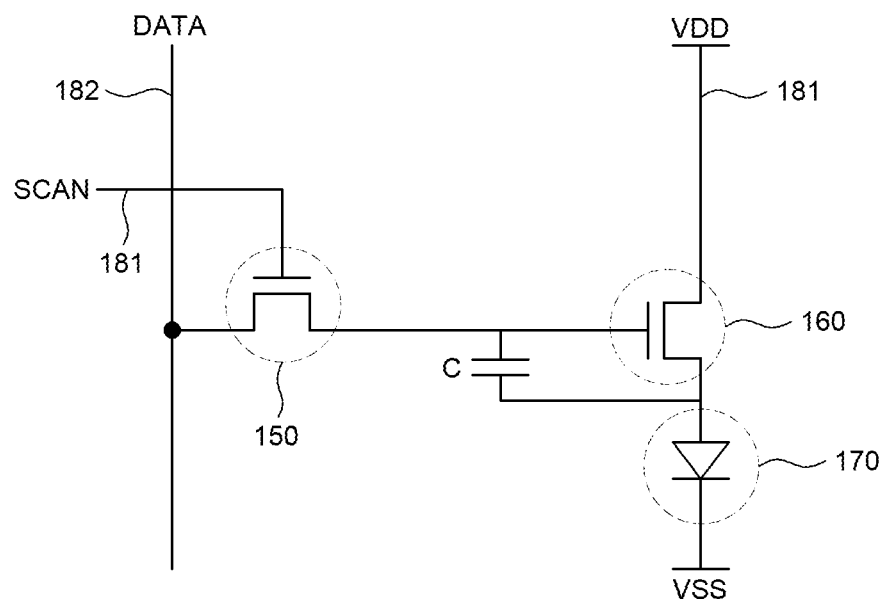
FIG. 5 is a circuit diagram of a sub-pixel of the display device according to an embodiment of the present disclosure.

FIG. 5 is a circuit diagram of a sub-pixel of the display device according to an embodiment of the present disclosure.

Hereinafter, for the convenience of description, a structure and an operation when a sub-pixel SPX of the display device according to an embodiment of the present disclosure is a pixel circuit of 2T (transistor) 1C (capacitor) will be described. However, the present disclosure is not limited thereto.

Referring to FIG. 4 and FIG. 5, in the display device according to an embodiment of the present disclosure, each sub-pixel SPX may include a switching transistor 150, a driving transistor 160, a storage capacitor C and an LED 170.

The switching transistor 150 applies a data signal DATA supplied through the second connection lines 182 to the driving transistor 160 and the storage capacitor C in response to a gate signal SCAN supplied through the first connection lines 181.

Further, the gate electrode 151 of the switching transistor 150 is electrically connected to the first connection lines 181. Also, the source electrode 153 of the switching transistor 150 is connected to the second connection lines 182. Further, the drain electrode 154 of the switching transistor 150 is connected to the gate electrode 161 of the driving transistor 160.

The driving transistor 160 may operate to enable a driving current according to a high-potential power VDD and the data voltage DATA supplied through the first connection lines 181 to flow in response to the data voltage DATA stored in the storage capacitor C.

Further, the gate electrode 161 of the driving transistor 160 is electrically connected to the drain electrode 154 of the switching transistor 150. Furthermore, the source electrode of the driving transistor 160 is connected to the first connection lines 181. Moreover, the drain electrode 164 of the driving transistor 160 is connected to the LED 170.

The LED 170 may operate to emit light according to a driving current formed by the driving transistor 160. Also, as described above, the n-electrode 175 of the LED 170 may be connected to the first connection lines 181 and thus may be applied with a low-potential power VSS. Further, the p-electrode 174 of the LED 170 may be connected to the drain electrode 164 of the driving transistor 160 and thus may be applied with a driving voltage corresponding to the driving current.

Each sub-pixel SPX of the display device according to an embodiment of the present disclosure is configured to have a 2T1C structure including the switching transistor 150, the driving transistor 160, the storage capacitor C and the LED 170 as an example. However, when a compensation circuit is added, each sub-pixel SPX may be configured in various ways, such as 3T1C, 4T2C, 5T2C, 6T1C, 6T2C, 7T1C or 7T2C.

As described above, the display device according to an embodiment of the present disclosure may include a plurality of sub-pixels on a first substrate which is a rigid substrate. Each of the plurality of sub-pixels SPX may include a switching transistor, a driving transistor, a storage capacitor and an LED.

Therefore, the display device according to an embodiment of the present disclosure may be stretched due to a lower substrate. Also, each first substrate includes a pixel circuit having a 2T1C structure. Thus, it is possible to emit light depending on a data voltage at each gate timing.

As described above, in the display device 100 according to an embodiment of the present disclosure, a plurality of display elements is connected to a single driving element. Thus, even when a display element is misaligned with the driving element, another display element may be connected to the driving element. Accordingly, in the display device according to an embodiment of the present disclosure, a driving failure of a sub-pixel can be suppressed. Therefore, it is possible to improve a failure rate of the display device according to an embodiment of the present disclosure.

Also, in the display device 100 according to an embodiment of the present disclosure, the first conductive substrate 121b and the second conductive substrate 122b which are connected in series to each other may be connected in parallel to the first connection line 181 to implement a low-potential power line and a high-potential power line. Accordingly, a line resistance of the low-potential power line and the high-potential power line may be remarkably decreased. Thus, it is possible to reduce or minimize a voltage drop of low-potential power and high-potential power. Therefore, the display device according to an embodiment of the present disclosure may stably display an image.

Further, in the display device 100 according to an embodiment of the present disclosure, a plurality of display elements, e.g., LEDs, is disposed in the first area A1 on the first substrate 121. Also, a plurality of driving elements, e.g., a driving transistor and a switching transistor, is disposed in the second area A2 on the first substrate 121. That is, a driving element is disposed between the first LED 170a and the second LED 170b. Since the display elements are disposed on both sides of the driving element, a step of an active area in the display device may decreases in height. Therefore, in the display device according to an embodiment of the present disclosure, the low step makes it possible to remarkably improve the process stability.

Hereinafter, a display device 200 according to another embodiment of the present disclosure will be described in detail. The display device 200 according to another embodiment of the present disclosure is different from the display device 100 according to an embodiment of the present disclosure in terms of the placement of a plurality of inorganic layers and a planarization layer. Accordingly, a detailed description of the same parts as those of the display device 100 according to an embodiment of the present disclosure will be omitted, and the above-described difference will be described in detail.

Another Embodiment of Present Disclosure

Figure 6:
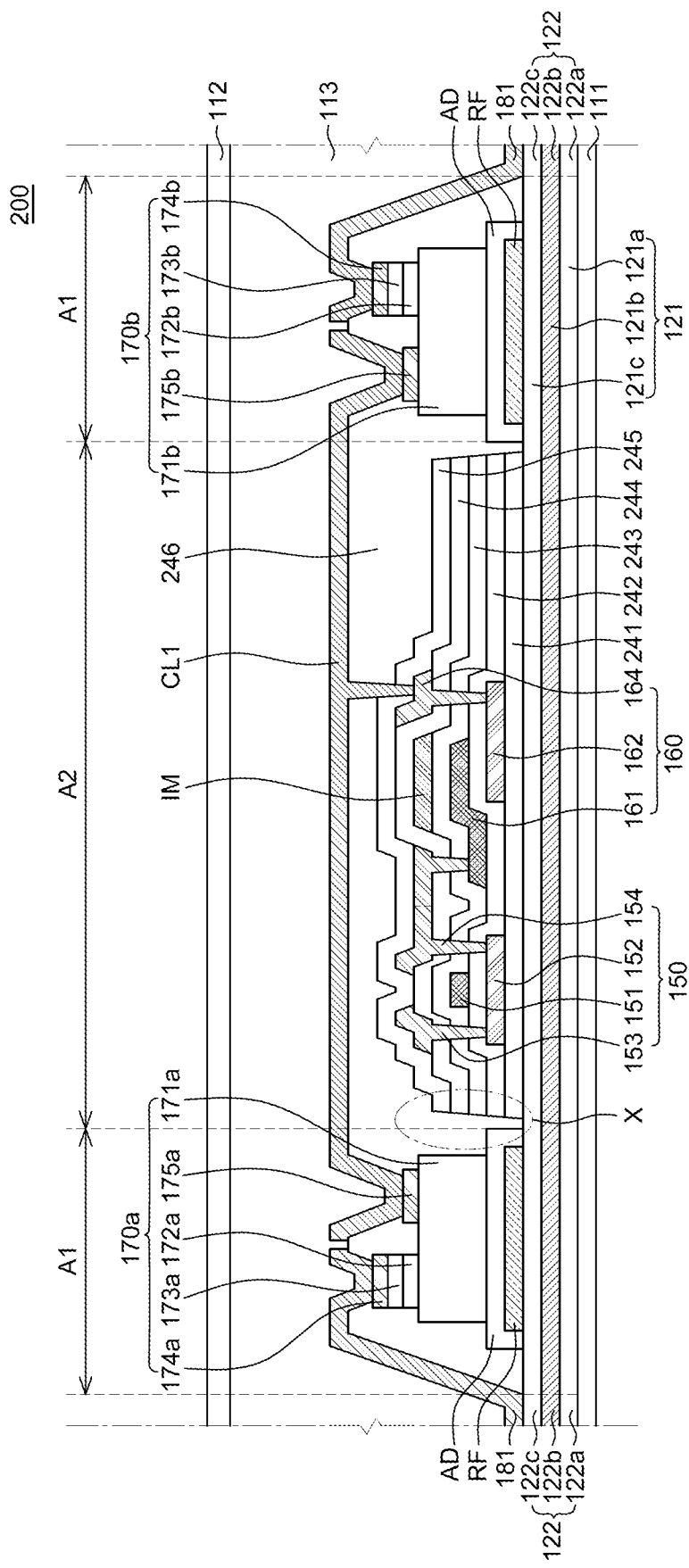
FIG. 6 is a cross-sectional view of a sub-pixel of a display device according to another embodiment of the present disclosure.

FIG. 6 is a cross-sectional view of a sub-pixel of a display device according to another embodiment of the present disclosure.

As shown in FIG. 6, in the display device 200 according to another embodiment of the present disclosure, a buffer layer 241, a gate insulating layer 242, a first interlayer insulating layer 243, a second interlayer insulating layer 244 and a passivation layer 245 may be patterned and formed only in a plurality of second areas A2. Specifically, the buffer layer 241, the gate insulating layer 242, the first interlayer insulating layer 243, the second interlayer insulating layer 244 and the passivation layer 245 may be disposed in an area corresponding to the second area A2 between the first LED 170a and the second LED 170b.

More specifically, both ends of the buffer layer 241 and the gate insulating layer 242 may not be in contact with a side surface of the adhesive layer AD, but may be spaced apart at a predetermined distance therefrom. Also, both ends of the first interlayer insulating layer 243, the second interlayer insulating layer 244 and the passivation layer 245 may not be in contact with a side surface of the first LED 170a and a side surface of the second LED 170b, but may be spaced apart at a predetermined distance therefrom.

Accordingly, a separation space X may be formed between the both ends of the buffer layer 241 and the gate insulating layer 242 and the side surface of the adhesive layer AD. Also, a separation space X may also be formed between the both ends of the first interlayer insulating layer 243, the second interlayer insulating layer 244 and the passivation layer 245 and the side surface of the first LED 170a and the side surface of the second LED 170b. Also, a planarization layer 246 is formed throughout the first area A1 and the second area A2 to cover the passivation layer 245, the first LED 170a and the second LED 170b. The planarization layer 246 serves to flatten upper portions of the switching transistor 150 and the driving transistor 160 and flatten upper surfaces and side surfaces of the first LED 170a and the second LED 170b. Also, the planarization layer 246 may fill the separation spaces X between the both ends of the buffer layer 241, the gate insulating layer 242, the first interlayer insulating layer 243, the second interlayer insulating layer 244 and the passivation layer 245 and the side surfaces of the first LED 170a and the side surfaces of the second LED 170b.

The planarization layer 246 may be formed as a single layer or a plurality of layers and may be made of an organic material. Thus, the planarization layer 246 may also be referred to as an organic insulating layer or an organic layer. For example, the planarization layer 246 may be made of an acrylic-based organic material, but is not limited thereto. Accordingly, the planarization layer 246 may compensate for steps between the side surfaces of the first LED 170a and the second LED 170b. Also, the planarization layer 246 may enhance the adhesion strength between the planarization layer 246 and the connection lines 181 disposed on an upper surface and a side surface of the planarization layer 246.

The buffer layer 241, the gate insulating layer 242, the first interlayer insulating layer 243, the second interlayer insulating layer 244 and the passivation layer 245 may also be made of inorganic materials like the buffer layer 241. Thus, the buffer layer 241, the gate insulating layer 242, the first interlayer insulating layer 243, the second interlayer insulating layer 244 and the passivation layer 245 may be damaged, such as easily cracked, while the display device 100 is stretched.

Therefore, in the display device 200 according to another embodiment of the present disclosure, the planarization layer 246 fills the separation spaces X between the both ends of the buffer layer 241, the gate insulating layer 242, the first interlayer insulating layer 243, the second interlayer insulating layer 244 and the passivation layer 245 and the side surfaces of the first LED 170a and the second LED 170b.

Thus, an impact on the buffer layer 241, the gate insulating layer 242, the first interlayer insulating layer 243, the second interlayer insulating layer 244 and the passivation layer 245 may be reduced or minimized while the display device 200 is stretched.

Therefore, the stretching reliability of the display device 200 according to another embodiment of the present disclosure can be improved.

Hereinafter, a display device 300 according to yet another embodiment of the present disclosure will be described in detail. The display device 300 according to yet another embodiment of the present disclosure is different from the display device 100 according to an embodiment of the present disclosure in terms of the placement of a contact line. Accordingly, a detailed description of the same parts as those of the display device 100 according to an embodiment of the present disclosure will be omitted, and the above-described difference will be described in detail.

Yet Another Embodiment of Present Disclosure

Figure 7:
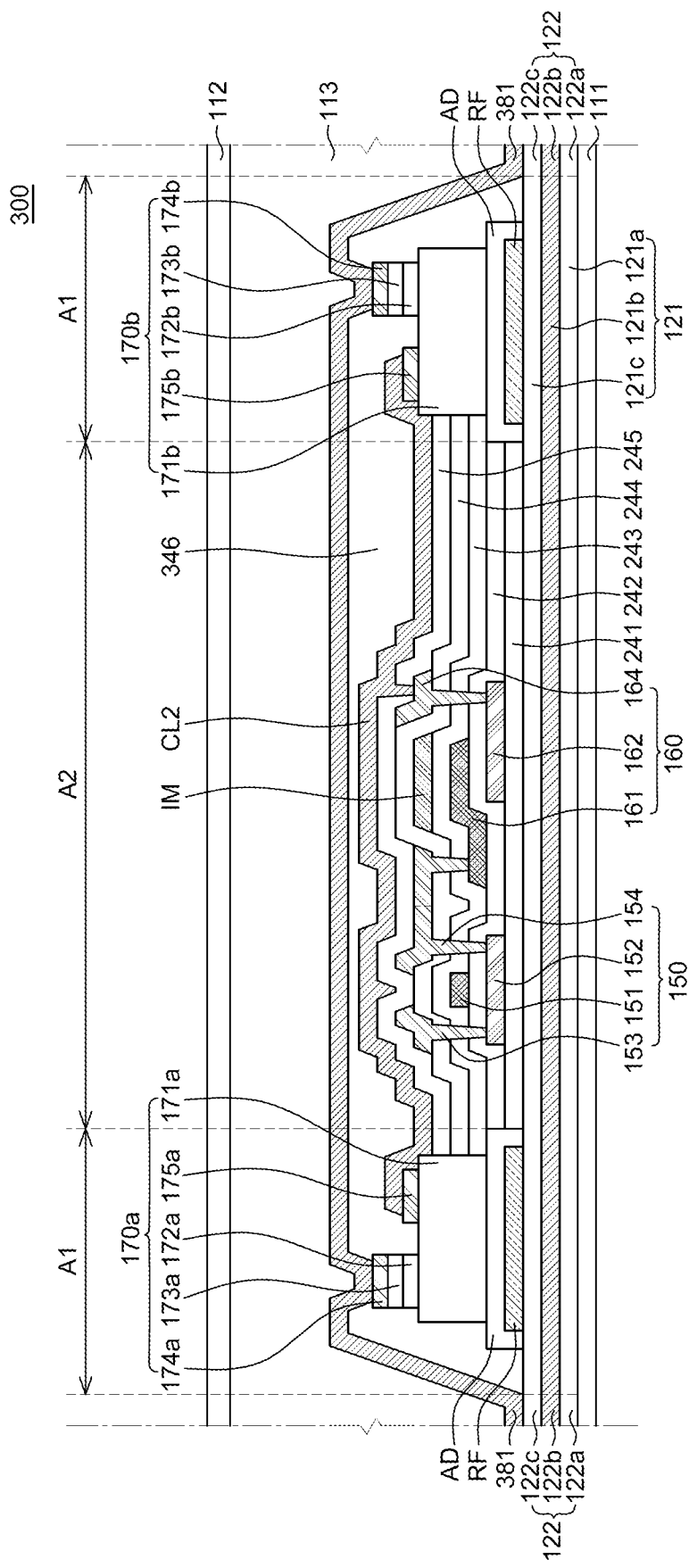
FIG. 7 is a cross-sectional view of a sub-pixel of a display device according to yet another embodiment of the present disclosure.

FIG. 7 is a cross-sectional view of a sub-pixel of a display device according to yet another embodiment of the present disclosure.

Referring to FIG. 7, in the display device 300 according to yet another embodiment of the present disclosure, a contact line CL2 is disposed on the passivation layer 145. The contact line CL2 serves to electrically connect the driving transistor 160 to the LEDs 170a and 170b. The contact line CL2 may be made of the same material as the source electrode 153 and the drain electrodes 154 and 164. Thus, the contact line CL2 may be made of a metal material such as copper (Cu), aluminum (Al), titanium (Ti) or molybdenum (Mo). Otherwise, the contact line CL2 may have a laminated structure of metal materials such as copper/molybdenum-titanium (Cu/MoTi), or titanium/aluminum/titanium (Ti/Al/Ti), but is not limited thereto.

The contact line CL2 is connected to the n-electrodes 175a and 175b of the LEDs 170a and 170b and to the drain electrode 164 of the driving transistor 160. However, the present disclosure is not limited thereto. The contact line CL2 may be connected to the source electrode of the driving transistor 160 depending on the type of the driving transistor 160. The n-electrodes 175a and 175b of the LEDs 170a and 170b may be electrically connected to the drain electrode 164 of the driving transistor 160 by the contact line CL2.

Also, a planarization layer 346 is formed throughout the first area A1 and the second area A2 to cover the contact line CL2, the first LED 170a and the second LED 170b. That is, the contact line CL2 may be disposed under the planarization layer 346. The planarization layer 346 serves to flatten an upper portion of the contact line CL2 and flatten upper surfaces and side surfaces of the first LED 170a and the second LED 170b. The planarization layer 346 may be formed as a single layer or a plurality of layers and may be made of an organic material. Thus, the planarization layer 346 may also be referred to as an organic insulating layer. For example, the planarization layer 346 may be made of an acrylic-based organic material, but is not limited thereto. Accordingly, the planarization layer 346 may compensate for steps between the side surfaces of the first LED 170a and the second LED 170b. Also, the planarization layer 346 may enhance the adhesion strength between the planarization layer 346 and connection lines 381 disposed on an upper surface and a side surface of the planarization layer 346.

Further, the first connection line 381 is connected to the p-electrodes 174a and 174b of the LEDs 170a and 170b through contact holes formed in the planarization layer 346. More specifically, as shown in FIG. 7, the first connection line 381 connected to the p-electrodes 174a and 174b of the LEDs 170a and 170b may be in contact with the upper surface and the side surface of the planarization layer 346 disposed on the first substrate 121 and may be extended to an upper surface of the second substrate 122. More specifically, the first connection line 381 may be extended without being disconnected on the planarization layer 346. Therefore, low-potential power, which is a common voltage, may be applied to the p-electrodes 174a and 174b of the LEDs 170a and 170b through the first connection line 381.

When the display device 300 is turned on, a driving voltage corresponding to a data voltage is applied to the drain electrode 164 of the driving transistor 160. Thus, the driving voltage corresponding to a data voltage is applied to the n-electrodes 175a and 175b of the LEDs 170a and 170b through the contact line CL2. Meanwhile, low-potential power, which is a common voltage, is applied to the p-electrodes 174a and 174b of the LEDs 170a and 170b through the first connection line 381. Therefore, the driving voltage and the low-potential power of different levels may be applied to the n-electrodes 175a and 175b and the p-electrodes 174a and 174b, respectively. Thus, the LEDs 170a and 170b may emit light.

In the display device 300 according to yet another embodiment of the present disclosure, a plurality of display elements is connected to a single driving element through a contact line CL3. Thus, even when a display element is misaligned with the driving element, another display element may be connected to the driving element. Accordingly, in the display device 300 according to yet another embodiment of the present disclosure, a driving failure of a sub-pixel can be suppressed. Therefore, it is possible to improve a failure rate of the display device 300 according to yet another embodiment of the present disclosure.

The embodiments of the present disclosure can also be described as follows:

According to an aspect of the present disclosure, the display device includes a stretchable lower substrate and a plurality of first substrates disposed on the lower substrate and in which pixels are disposed. The display device also includes a plurality of second substrates connecting first substrates adjacent to each other among the plurality of first substrates. The display device further includes a plurality of connection lines disposed on the plurality of second substrates and connecting the pixels. The first substrate includes a first lower insulating substrate, a first conductive substrate and a first upper insulating substrate which are sequentially laminated. The second substrate includes a second lower insulating substrate, a second conductive substrate and a second upper insulating substrate which are sequentially laminated. A plurality of display elements is disposed in a first area of the first substrate, and a driving element for driving all the plurality of display elements and an inorganic layer are disposed in a second area of the first substrate. An organic layer covering the plurality of display elements and the driving element is disposed in the first area and the second area of the first substrate. Thus, it is possible to suppress a driving failure of the display device.

The plurality of display elements may be connected to a single driving element through a contact line.

The contact line may be disposed on the organic layer.

The contact line may be made of the same material as the plurality of connection lines.

The contact line may be disposed under the organic layer.

The contact line may be made of the same material as a source electrode and a drain electrode of the driving element.

The first conductive substrate and the second conductive substrate may be connected in series to each other.

The first conductive substrate and the second conductive substrate connected in series to each other may be connected in parallel to any one of the plurality of connection lines.

The first conductive substrate and the second conductive substrate may be applied with low-potential power or high-potential power.

The first conductive substrate and the second conductive substrate may be disposed in the same layer and made of the same material.

The plurality of display elements may emit light of the same color.

The driving element may be a lateral LED.

Both ends of the inorganic layer may be in contact with side surfaces of the plurality of display elements.

Both ends of the inorganic layer may be spaced apart from side surfaces of the plurality of display elements.

The organic layer may fill a space between the both ends of the inorganic layer and the side surfaces of the plurality of display elements.

According to another aspect of the present disclosure, the display device includes a ductile substrate that is reversibly expandable and contractible. The display device also includes a plurality of first rigid substrates disposed on the ductile substrate and having a plate shape. The display device further includes a plurality of second rigid substrates disposed between the plurality of first rigid substrates and having a curved shape. The display device also includes a plurality of connection lines disposed on the plurality of second rigid substrates. The first rigid substrate is provided with a first conductive substrate, and the second rigid substrate is provided with a second conductive substrate. The plurality of connection lines, a plurality of first conductive substrates and a plurality of second conductive substrates are electrically connected. Thus, it is possible to reduce a step of an active area and thus it is possible to improve the process stability.

The first conductive substrate and the second conductive substrate may be connected in series to each other.

The first conductive substrate and the second conductive substrate connected in series to each other may be connected in parallel to any one of the plurality of connection lines.

A first LED and a second LED that emit light of the same color may be disposed on the first rigid substrate, and a driving element for driving all the first LED and the second LED may be disposed between the first LED and the second LED on the first rigid substrate.

Each of the first LED and the second LED may be a lateral LED.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a stretchable lower substrate;
a plurality of first substrates disposed on the lower substrate and in which pixels are disposed;
a plurality of second substrates disposed on the lower substrate and each coupling first substrates adjacent to each other among the plurality of first substrates; and
a plurality of connection lines disposed on the plurality of second substrates and coupling the pixels,
wherein the first substrate includes a first lower insulating substrate, a first conductive substrate disposed on the first lower insulating substrate, and a first upper insulating substrate disposed on the first conductive substrate,
wherein one surface of the first lower insulating substrate contacts one surface of the first conductive substrate and one surface of the first upper insulating substrate contacts another surface of the first conductive substrate opposite to the one surface of the first conductive substrate, and
wherein each of the pixels is disposed on the first upper insulating substrate included in each of the plurality of first substrates.

2. The display device according to claim 1,
wherein the second substrate includes a second lower insulating substrate, a second conductive substrate, and a second upper insulating substrate which are sequentially laminated.

3. The display device according to claim 2, wherein the first conductive substrate and the second conductive substrate are coupled in series to each other.

4. The display device according to claim 3, wherein the first conductive substrate and the second conductive substrate coupled in series to each other are coupled in parallel to any one of the plurality of connection lines.

5. The display device according to claim 2, wherein the first conductive substrate and the second conductive substrate are applied with either a first potential power or a second potential power having a second voltage level higher than a first voltage level of the first potential power.

6. The display device according to claim 2, wherein the first conductive substrate and the second conductive substrate are disposed on a same layer and made of a same material.

7. The display device according to claim 1, wherein, in each of the plurality of first substrates,
a plurality of display elements is disposed in a first area of the first substrate,
a driving element for driving all the plurality of display elements and an inorganic layer are disposed in a second area of the first substrate; and
an organic layer covering the plurality of display elements and the driving element is disposed in the first area and the second area of the first substrate.

8. The display device according to claim 7, wherein the plurality of display elements is coupled to a single driving element through a contact line.

9. The display device according to claim 8, wherein the contact line is disposed on the organic layer.

10. The display device according to claim 9, wherein the contact line is made of a same material as the plurality of connection lines.

11. The display device according to claim 8, wherein the contact line is disposed under the organic layer.

12. The display device according to claim 11, wherein the contact line is made of a same material as a source electrode and a drain electrode of the driving element.

13. The display device according to claim 7, wherein the plurality of display elements emits light of a same color.

14. The display device according to claim 7, wherein the display elements are a lateral light emitting diode.

15. The display device according to claim 7, wherein both ends of the inorganic layer are in contact with side surfaces of the plurality of display elements.

16. The display device according to claim 7, wherein both ends of the inorganic layer are spaced apart from side surfaces of the plurality of display elements.

17. The display device according to claim 16, wherein the organic layer fills a space between the both ends of the inorganic layer and the side surfaces of the plurality of display elements.

18. The display device according to claim 7, wherein the first area and the second area do not overlap with each other.

19. The display device according to claim 2, wherein the first conductive substrate is made of a metal material having reflectivity.

20. The display device according to claim 1, wherein the plurality of first substrates and the plurality of second substrates are more rigid than the lower substrate.

21. A display device, comprising:
a ductile substrate that is reversibly expandable and contractible;
a plurality of first rigid substrates disposed on the ductile substrate and having a plate shape, each of pixels is disposed on each of the plurality of first rigid substrates;
a plurality of second rigid substrates disposed on the ductile substrate between the plurality of first rigid substrates; and
a plurality of connection lines disposed on the plurality of second rigid substrates,
wherein the first rigid substrates include a first lower insulating substrate, a first conductive substrate disposed on the first lower insulating substrate, and a first upper insulating substrate disposed on the first conductive substrate,
wherein one surface of the first lower insulating substrate contacts one surface of the first conductive substrate and one surface of the first upper insulating substrate contacts another surface of the first conductive substrate opposite to the one surface of the first conductive substrate, and
wherein each of the pixels is disposed on the first upper insulating substrate included in each of the plurality of first rigid substrates.

22. The display device of claim 21,
wherein the second rigid substrate is provided with a second conductive substrate, and
wherein any one of the plurality of connection lines, the first conductive substrate and the second conductive substrate are coupled to each other.

23. The display device according to claim 22, wherein the first conductive substrate and the second conductive substrate are coupled in series to each other.

24. The display device according to claim 23, wherein the first conductive substrate and the second conductive substrate coupled in series to each other are coupled in parallel to any one of the plurality of connection lines.

25. The display device according to claim 22,
wherein a first light emitting diode (LED) and a second LED that emit light of the same color are disposed on the first rigid substrate, and
a driving element for driving all the first LED and the second LED is disposed between the first LED and the second LED on the first rigid substrate.

26. The display device according to claim 25, wherein each of the first LED and the second LED is a lateral LED.

27. The display device according to claim 25, wherein the first LED and the second LED are disposed in a first area of the first rigid substrate,
wherein the driving element is disposed in a second area of the first rigid substrate, and
wherein the first area and the second area do not overlap with each other.

28. The display device according to claim 22, wherein the first conductive substrate is made of a metal material having reflectivity.

\* \* \* \* \*